US006982558B2

(12) United States Patent
Bryndzia et al.

(10) Patent No.: US 6,982,558 B2
(45) Date of Patent: Jan. 3, 2006

(54) ELECTRIC CIRCUIT TEST DEVICE

(75) Inventors: Michael Bryndzia, Baldwinsville, NY (US); Kent Morgan, Groton, NY (US)

(73) Assignee: Pass & Seymour, Inc., Syracuse, NY (US)

( * ) Notice: Subject to any disclaimer, the term of this patent is extended or adjusted under 35 U.S.C. 154(b) by 55 days.

(21) Appl. No.: 10/646,102

(22) Filed: Aug. 22, 2003

(65) Prior Publication Data

US 2004/0246003 A1 Dec. 9, 2004

Related U.S. Application Data

(60) Provisional application No. 60/439,371, filed on Jan. 9, 2003.

(51) Int. Cl.
 *H01H 31/02* (2006.01)
(52) U.S. Cl. ........................................ 324/556; 324/508
(58) Field of Classification Search ........ 324/508–511, 324/555, 556
See application file for complete search history.

(56) References Cited

U.S. PATENT DOCUMENTS

| | | | | |
|---|---|---|---|---|
| 3,922,600 A | * | 11/1975 | Roveti | 324/508 |
| 4,318,578 A | | 3/1982 | Ericson et al. | |
| 4,929,887 A | * | 5/1990 | Robitaille et al. | 324/556 |
| 5,065,104 A | * | 11/1991 | Kusko et al. | 324/508 |
| 5,109,200 A | * | 4/1992 | Dushane et al. | 324/508 |
| 5,525,908 A | * | 6/1996 | Brownell | 324/508 |
| 5,625,285 A | * | 4/1997 | Virgilio | 324/508 |
| 6,657,435 B2 | * | 12/2003 | Brown | 324/508 |

* cited by examiner

*Primary Examiner*—Vincent Q. Nguyen
*Assistant Examiner*—Timothy J. Dole
(74) *Attorney, Agent, or Firm*—Daniel P. Malley; Bond, Schoeneck & King, PLLC

(57) ABSTRACT

The present invention is directed to an electric circuit test device for testing an electric circuit. The test device is insertable into a receptacle. The receptacle includes electrical terminals coupled to the electrical circuit. The device includes a housing characterized by a longitudinal axis. A plug blade assembly is disposed within the housing and configured to mate with the electrical terminals. Electrical continuity is established between the plug blade assembly and the electric circuit. A fault detection circuit is coupled to the plug blade assembly and disposed within the housing. The fault detection circuit is configured to detect a circuit status condition in the electrical circuit. A circuit status indicator assembly is coupled to the fault detection circuit and disposed normal thereto. The circuit status indicator assembly includes semiconductor light indicators that are connected substantially normal to the circuit status indicator assembly. The semiconductor light indicators are configured to emit a code corresponding to the circuit status condition in a direction normal to the longitudinal axis, with a viewing angle less than approximately 30°.

39 Claims, 7 Drawing Sheets

ELECTRIC CIRCUIT TEST DEVICE

CROSS-REFERENCE TO RELATED APPLICATIONS

This Application claims the benefit of priority under 35 U.S.C. §119(e) of U.S. Provisional Patent Application Ser. No. 60/439,371 filed on Jan. 9, 2003, the content of which is relied upon and incorporated herein by reference in its entirety.

BACKGROUND OF THE INVENTION

1. Field of the Invention

The present invention relates generally to electrical testing devices, and particularly to, ground continuity testing devices.

2. Technical Background

Ground continuity monitors that indicate loss or deterioration of ground continuity in an electrical distribution system are known in the art. An early version of a connector that included a ground continuity monitor, also known as a ground fault detector, employed a very simple circuit that consisted of only a resistor and a neon lamp. In one approach that has been considered, a ground fault detector comprises a plug to be received within a receptacle. One drawback to the ground fault detector is that there is only indication of proper grounding in the circuit from the source of power in the electrical distribution system to the ground fault detector itself.

In another approach that has been considered, an electrical connector includes a ground fault detector and an indicator circuit. Electrical contact is made between the various portions of the electrical connector and a circuit to provide a visual indication of proper connection and grounding. Visual indication is provided by a lamp that is visible from the exterior of the connector body. Unfortunately, the lamp is insufficiently bright, making it ineffective. The lamp may provide the visual indication in a directional manner, which may be shielded from view by connector orientation or other external physical obstructions near the connector.

In yet another approach that has been considered, an electrical connector includes a housing and means for establishing electrical connection with contact blades of a plug, or with receptacle contacts in a socket. The connector includes a conductor cable that is connected to the electrical connection means and to a ground fault detector circuit and an indicator mounted within the housing.

What is needed is a circuit tester that is configured to test for a multiplicity of fault conditions including ground fault detection, to provide continuous indication of the use of safe power. Further, a circuit tester is needed to test for at least one fault condition, displaying the fault condition with improved brightness. Further, a circuit tester is needed that is housed in a plug or a connector. Further, a circuit tester is needed to test for both a fault condition in the circuit between the source of power of the electrical distribution system and the circuit tester. Further, a circuit tester is needed that provides power to a load device that indicates at least one fault condition associated with the load device.

SUMMARY OF THE INVENTION

The present invention addresses the aforementioned needs. The device of the present invention is configured to test for a multiplicity of fault conditions in a circuit disposed between the source of power of an electrical distribution system and the device. In another embodiment, the device is configured to test for a fault condition associated with the load device. The present invention may also be configured to be self-monitoring.

One aspect of the present invention is directed to an electric circuit test device for testing an electric circuit. The test device is insertable into a receptacle. The receptacle includes electrical terminals coupled to an electrical circuit. The device includes a housing characterized by a longitudinal axis. A plug blade assembly is disposed within the housing and configured to mate with the electrical terminals. Electrical continuity is established between the plug blade assembly and the electric circuit. A fault detection circuit is coupled to the plug blade assembly and disposed within the housing. The fault detection circuit is configured to detect a circuit status condition in the electrical circuit. A circuit status indicator assembly is coupled to the fault detection circuit and disposed normal thereto. The circuit status indicator assembly includes semiconductor light indicators that are connected substantially normal to the circuit status indicator assembly. The semiconductor light indicators are configured to emit a code corresponding to the circuit status condition in a direction normal to the longitudinal axis, with a viewing angle less than approximately 30°.

In another aspect, the present invention is directed to an electric circuit test device for testing a multi-phase center grounded electric circuit. The test device is insertable into a receptacle. The receptacle includes electrical terminals coupled to the electrical circuit. The device includes a plug blade assembly disposed within the housing and configured to mate with the electrical terminals. Electrical continuity is thereby established between the plug blade assembly and the electric circuit. A fault detection circuit is coupled to the plug blade assembly. The fault detection circuit is configured to detect a circuit status condition in the multi-phase center grounded electrical circuit. A circuit status indicator assembly is coupled to the fault detection circuit. The circuit status indicator assembly is configured to emit a code corresponding to the circuit status condition of the multi-phase center grounded electric circuit. Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Figure 1:
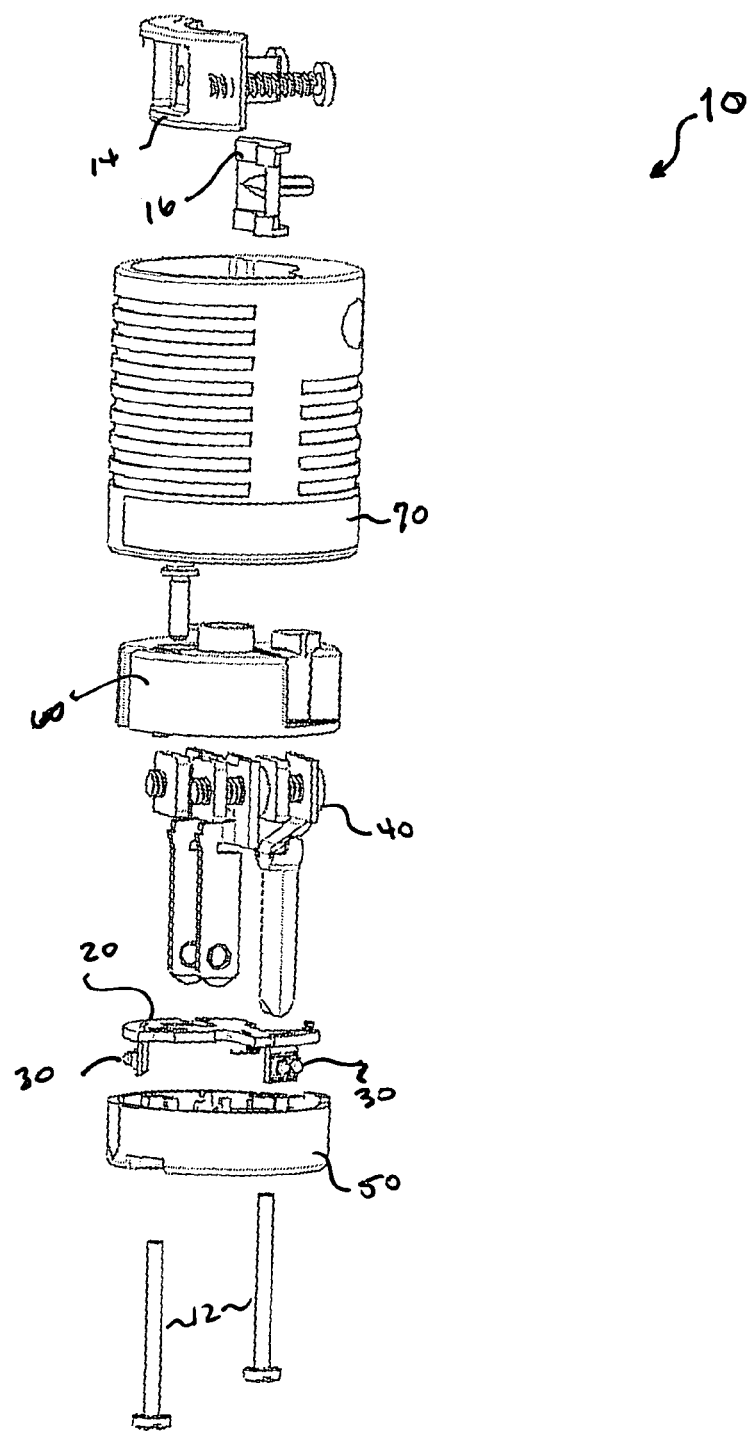
FIG. 1 is an exploded view of the electrical circuit test device in accordance with a first embodiment of the present invention.

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the electrical circuit test device of the present invention is shown in FIG. 1, and is designated generally throughout by reference numeral 10.

In accordance with the invention, the present invention is directed to an electric circuit test device for testing an electric circuit. The test device is insertable into a receptacle. The receptacle includes electrical terminals coupled to an electrical circuit. The device includes a housing characterized by a longitudinal axis. A plug blade assembly is disposed within the housing and configured to mate with the electrical terminals. Electrical continuity is established between the plug blade assembly and the electric circuit. A fault detection circuit is coupled to the plug blade assembly and disposed within the housing. The fault detection circuit is configured to detect a circuit status condition in the electrical circuit. A circuit status indicator assembly is coupled to the fault detection circuit and disposed normal thereto. The circuit status indicator assembly includes semiconductor light indicators that are connected substantially normal to the circuit status indicator assembly. The semiconductor light indicators are configured to emit a code corresponding to the circuit status condition in a direction normal to the longitudinal axis, with a viewing angle less than approximately 30°. The present invention is versatile in that it is configured to test for a multiplicity of fault conditions, including ground continuity. Further, the present invention may also be configured to test for both multiple fault conditions in the circuit between the breaker and a wall receptacle, and a fault condition in a load device. The present invention is also self-monitoring.

As embodied herein, and depicted in FIG. 1, an exploded view of the electric circuit test device 10 in accordance with a first embodiment of the present invention is disclosed. The functionality of device 10 resides in fault detection assembly 20 and at least one fault indicator assembly 30. As discussed in detail below, these elements are coupled both electrically and mechanically. The contact blades of plug blade assembly 40 are inserted into fault detection assembly 20 and display cap 50. The display cap 50 is apertured, or has at least one transparent or alternatively translucent portion in order to emit light from the fault indicator assembly 30 to the user. The other end of plug blade assembly 40 is inserted into end cap 60. The sub-assembly formed from fault detection assembly 20, indicators 30, blade assembly 40, display cap 50, and end cap 60 is ultimately inserted and disposed in housing 70. Housing 70 also includes cable retainer elements 14 and 16. The sub-assembly is secured within housing 70 by way of screws 12, which are inserted into display cap 50 and housing 70.

Figure 2:
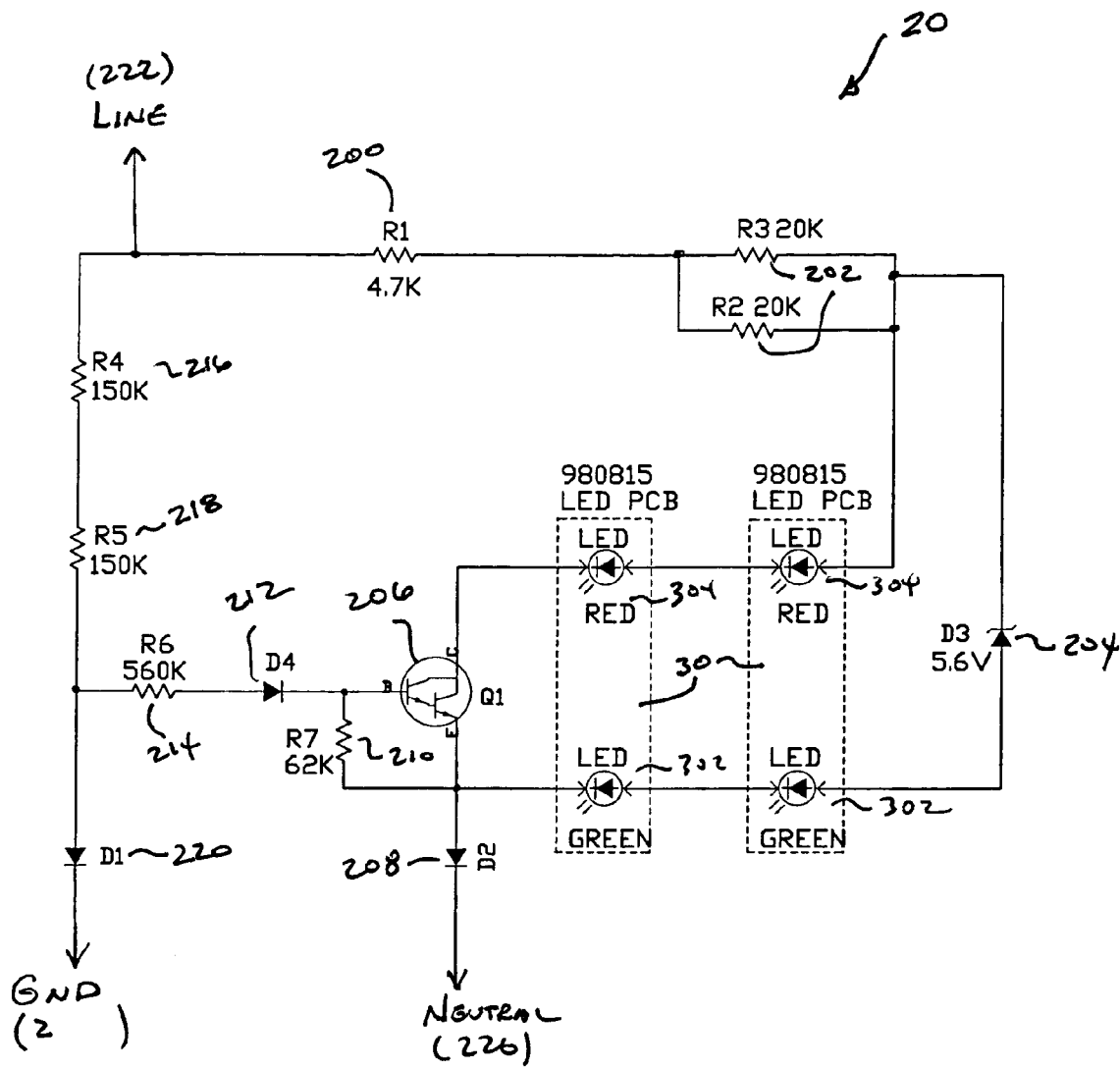
FIG. 2 is a circuit diagram of a fault detection circuit in accordance with an embodiment of the invention.

Referring to FIG. 2, a circuit diagram of a fault detection circuit in accordance with an embodiment of the invention is shown. FIG. 2 illustrates an embodiment of device 10 that is used for testing grounded neutral circuits. This embodiment of device 10 tests for faults "upstream" from the receptacle. In other words, device 10 tests for fault conditions in the electric circuit from the receptacle to the power source of the electrical distribution system. Those of ordinary skill in the art will recognize that a grounded neutral circuit is commonly referred to as a single phase circuit, that typically supplies 120 VAC power. However, in certain lighting applications the grounded neutral circuit may support 277 VAC. In industrial applications it may support 347 VAC.

In a properly wired configuration, 120 VAC is applied to line input 222, the ground blade is coupled to ground input 224, and the neutral blade of assembly 40 is coupled to neutral input 226. Under a normal status condition, the voltage divider formed by resistors 210 and 214 is used to bias transistor 206 such that it is non-conducting when the difference of voltage potential between the neutral and ground is within predetermined limits. This arrangement is used to accommodate situations when the load current is out of phase with the line voltage, or when the circuit is under heavy load and the resistance of the neutral wiring causes a normal voltage drop in the neutral conductor. Thus, most of the current traverses the path that includes resistor 200, resistors 202, diode 204, LEDs 302, and diode 208. As a result, green LEDs 302 are illuminated. The voltage across diode 204 and LEDs 302 is clamped at approximately 10 volts. The current flow is approximately 3.7 mA TRMS. A small amount of leakage current traverses series resistors 216 and 218 and flows through diode 220.

When the ground conductor is open, or conductivity is poor, the voltage divider (resistors 210, 214) and the ground resistance changes the bias on transistor 206 causing it to become saturated and current flows through LEDs 304. Thus, when red LEDs 304 are illuminated, a user is alerted to the fact that ground in the circuit-under-test is open or very poor. When transistor 206 is saturated, VCE is approximately 2V. The voltage across LEDs 304 and transistor 206 is clamped at approximately 6 volts.

When either the line conductor or the neutral conductor is missing, there is virtually no current flowing through fault detection assembly 20. In this scenario, neither LEDs 302 nor LEDs 304 of fault indicators 30 are illuminated. As such, no LED illumination alerts the user that the line conductor or the neutral conductor in the circuit-under-test is either missing, damaged, or improperly wired. In another scenario, when both the red LEDs 304 and the green LEDs 302 are illuminated, the user is alerted to reversed polarity condition, e.g., that the line conductor and the neutral conductor were reversed during wiring. Under certain conditions, the reverse polarity condition may only illuminate red LEDs 304.

Thus, because multiple LEDs are employed, each of the fault conditions described above is represented by fault indicator assembly 30 using a Boolean code. It will be apparent to those of ordinary skill in the pertinent art that modifications and variations can be made to indicator assembly 30 of the present invention depending on the sophistication of the testing device and choice of indicator element. For example, the LEDs may be replaced by other light emitting elements. Further, the indicator may also be replaced by any type of electromagnetic emitter such as an RF transmitter, or a data line, etc. This arrangement may be suitable when device 10 is configured to transmit a status to a central monitoring facility on a periodic basis. Indicator assembly 30 may also be implemented on the basis of an acoustic indicator alarm.

As an aside, resistors 202 are disposed in parallel to accommodate the layout of board 20. Those of ordinary skill in the art will recognize that they may be replaced by a single 10 kΩ resistor.

There are several safety features included in the above described design. First, diodes 212, 208, and 220 reverse bias to prevent damage to device 10 in the event of mis-wiring. Thus, device 10 is operable after such a situation occurs. It should also be mentioned that device 10 only operates during the positive half of the line cycle because of the current blocking action of diodes 208 and 220 during the negative half of the cycle. Second, those of ordinary skill in the art will recognize that series resistors 216 and 218 may be replaced by a single resistor. However, the series arrangement provides redundancy. If one resistor becomes defective or burns out, the other resistor is rated to handle the current. Thus, at no time will ground current exceed 500 µA.

Figure 3:
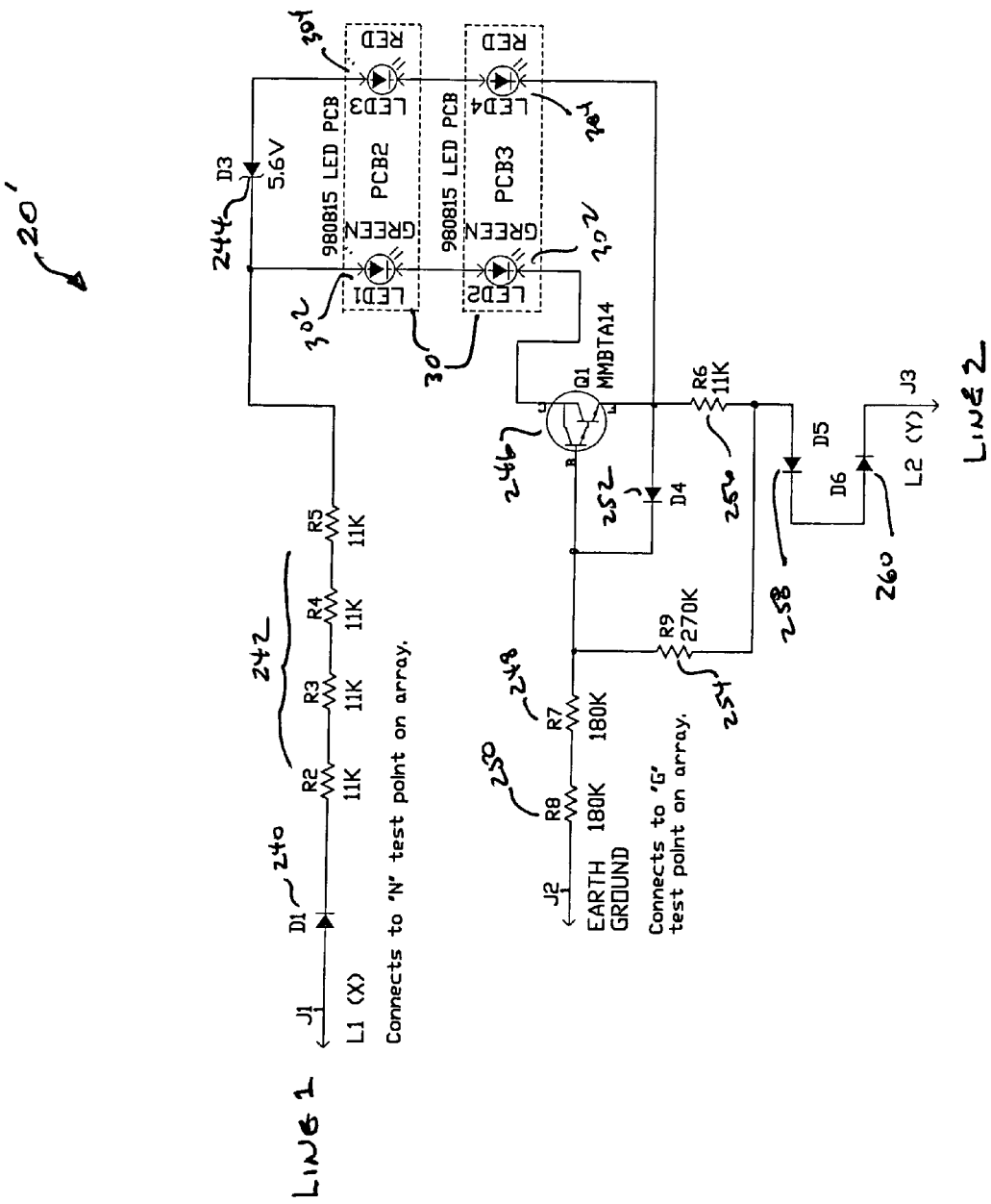
FIG. 3 is a circuit diagram of a fault detection circuit in accordance with another embodiment of the invention.

Referring to FIG. 3, a circuit diagram of a fault detection circuit in accordance with another embodiment of the invention is shown. The circuit depicted in FIG. 3 is employed to test for fault conditions in a center grounded circuit. Again, device 10 tests for faults that occur in the electric circuit between the source of power of the electrical distribution system and device 10. As those of ordinary skill in the art will appreciate, a center grounded circuit typically supplies 240 VAC. Line 1 carries first phase 120 VAC power whereas Line 2 carries the second phase of 120 VAC power. Typically the phases are 180 degrees apart.

Under normal conditions, with good ground continuity in the electric circuit, device 10 operates by using the current flow from the ground terminal to one line terminal to bias transistor 246 on to thereby illuminate green LEDs 302. Current flowing through the voltage divider of resistors 250, 248, and 254 biases transistor 246 on. The value of resistor 254 is chosen so the voltage drop across it is slightly greater than the sum of the voltage drops across the base-emitter junction of transistor 246 and resistor 256. As such, current flows through series diode 240, resistors 242, LEDs 302, transistor 246, resistor 256 and diodes 258, 260, to thereby illuminate green LEDs 302.

A ground fault condition occurs when the ground conductor in the electric circuit is open, or when the resistance rises because continuity in the conductor is poor. As the ground resistance rises, or the ground is disconnected, the current flow from the ground terminal through resistors 250, 248, and 254 decreases, or ceases, and transistor 246 is biased to a non-conducting state. In this scenario, the current path is through resistors 242, diode 244, LEDs 304, resistor 256, diodes 258, 260, and 244, to thereby illuminate red LEDs 304.

If one of the 120 VAC lines is open or missing, current cannot flow because no circuit exists. When this fault condition exists, neither green LEDs 302 nor red LEDs 304 are illuminated. When a user detects the absence of any illuminated LEDs, the user is alerted to the "no-circuit" condition.

When a particular mis-wiring fault condition occurs, i.e., when Line J1 is reversed with ground J2, green LEDs 302 and red LEDs 304 are alternately illuminated. Each turns on and off during a portion of each 60 Hz cycle produced by the power source of the electrical distribution system. To the user, it appears as if the red LEDs 304 and the green LEDs 302 are flickering. This indicator state corresponds to the aforementioned mis-wiring condition. On the other hand, when Line J2 is swapped with ground, only red LEDs 304 are illuminated.

Like the embodiment depicted in FIG. 2, because multiple LEDs are employed, each of the fault conditions described above is represented by fault indicator assembly 30 using a Boolean code. Again, it will be apparent to those of ordinary skill in the pertinent art that modifications and variations can be made to indicator assembly 30 of the present invention depending on the sophistication of the testing device and choice of indicator element. For example, the LEDs may be replaced by other light emitting elements. Further, the indicator may also be replaced by any type of electromagnetic emitter such as an RF transmitter, or a data line, etc. This arrangement may be suitable when device 10 is configured to transmit a status to a central monitoring facility on a periodic basis. Indicator assembly 30 may also be implemented on the basis of an acoustic indicator alarm.

Again, there are several safety features included in the above described design. First, diodes 240, 252, 258 and 260 reverse bias to prevent damage to device 10 in the event of mis-wiring. Thus, device 10 is operable after such a situation occurs. It should also be mentioned that device 10 only operates during the positive half of the line cycle because of the current blocking action of diode 240 during the negative half of the cycle. Second, those of ordinary skill in the art will recognize that series resistors 242 may be replaced by a single resistor. Likewise, series resistors 248 and 250 may be replaced by a single resistor. However, the series arrangement provides redundancy. If one resistor becomes defective or burns out, the other resistor is rated to handle the current. Again, at no time will ground current exceed 500 µA.

Figure 4:
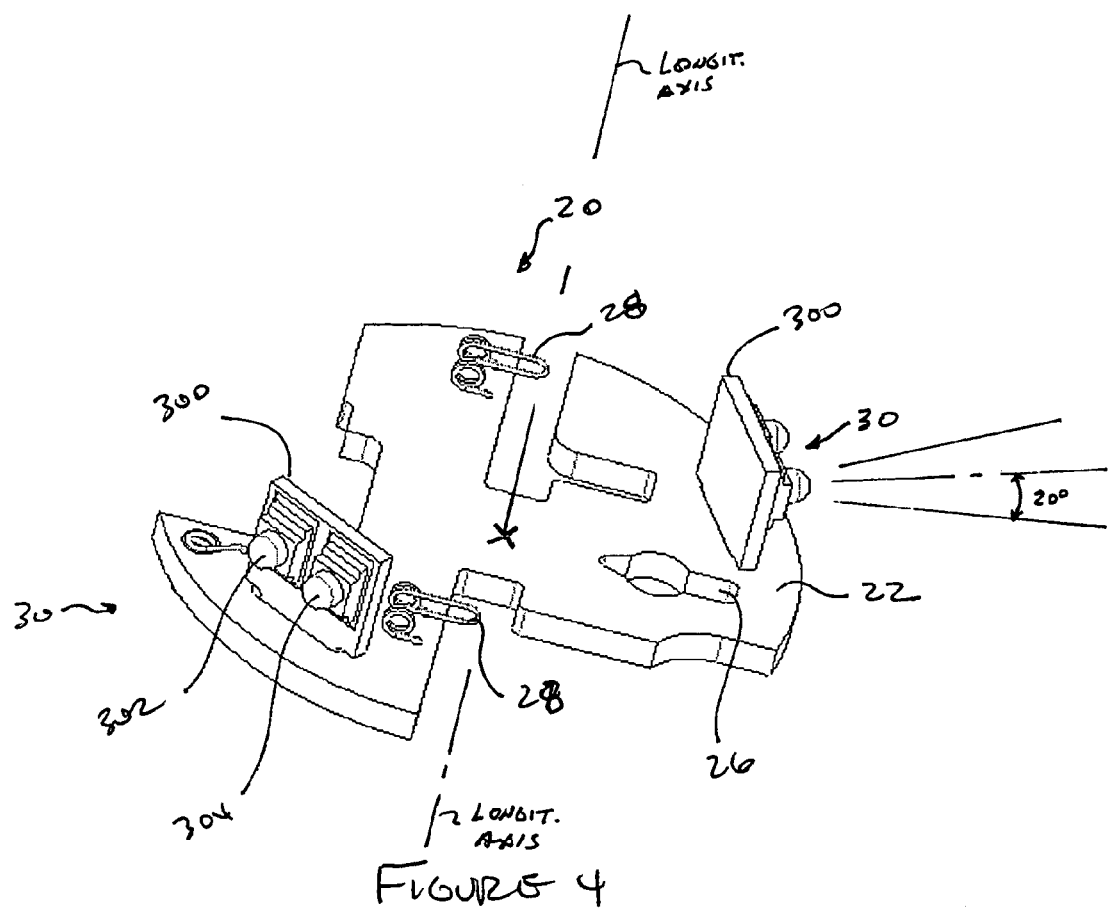
FIG. 4 is a detail view of the fault indicator depicted in FIG. 1.

Referring to FIG. 4, a detail view of the relationship between fault detection assembly 20 and fault indicator 30 depicted in FIG. 1 is shown. Fault detection assembly 20 is disposed on circuit board 22. In this embodiment, circuit board 22 is a disk-shaped board that has a radius normal to the longitudinal axis of device 10. Torsion spring contacts 28 are soldered onto board 22. Circuit board 22 also includes plated through holes 26. Each fault indicator includes a green LED 302 and a red LED 304 pair, which are mounted on a standoff member 300. Each standoff member extends in a direction that is normal to the plane of circuit board 22. Thus, the LEDs radiate in a direction normal to the longitudinal direction.

Torsion spring contacts 28 are a means to transmit electrical current from the terminal wire clamp to the circuit board. This design ensures electrical contact from the board to blade assembly 40 regardless of the wire clamp screw position. The spring action ensures contact with the terminal assembly to thereby maintain power to the circuit board. Plated through holes 26 represent another means to transmit electrical current from blade assembly 40 to the circuit board. This design ensures direct electrical contact therebetween.

The advantages of using LEDs instead of other indicators include an improved directivity and a longer operational life-span of LEDs vis a vis other components, such as neon lights. Both red and green LEDs having a viewing angle within a range of 20°–25°. On the other hand, a neon bulb has omnidirectional directivity. The operational life span of a neon bulb is meaured in thousands of hours, whereas the operational life span of an LED is measured in at least tens of thousands of hours. During use, approximately 2–4 mA of current flows through each LED. Green LED 302 radiates with a luminous intensity of approximately 45 mcd. Red LED 304 radiates with a luminous intensity of approximately 82 mcd.

Bulb standoffs 300 are employed to insulate and locate a plurality of indicator devices at the proper height, angle and lead spacing. When light emitting devices are employed, the height and the angular position for the light emitting devices are critical for proper light dispersion through the body. The close proximity of the LED leads requires accurate spacing from each other and other live components. Standoff 300 performs all of the aforementioned functions, and is also employed as a tool to form the LED leads to ensure the correct viewing angle. Further, the design of standoffs 300 enables the use of LED components having improved intensity. For example, radially radiating designs typically employ yoke LED components which have a luminous intensity that is a fraction of the intensity of the current design.

In another embodiment, indicator assembly 30 includes three standoffs 300. Thus, indicators are disposed at 120° intervals around the circumference of circuit board 22.

Figure 5:
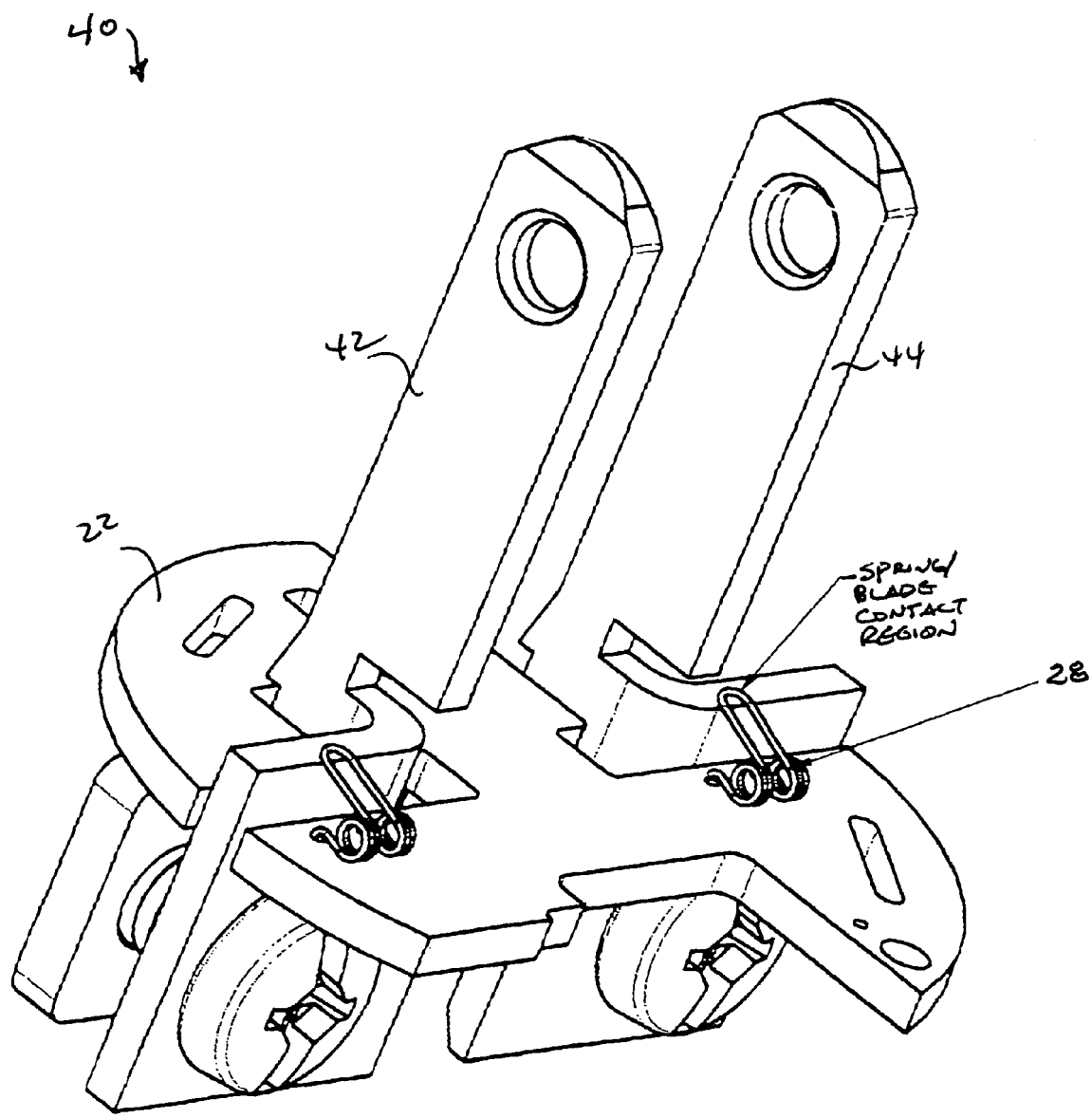
FIG. 5 is a detail view of the blade assembly.

Referring to FIG. 5, a detail view of the blade assembly 40 is shown. As shown, blade 42 and blade 44 are inserted into holes disposed in circuit board 22. During insertion, each blade is forced against torsion spring 28, which is soldered to board 22.

Figure 6:
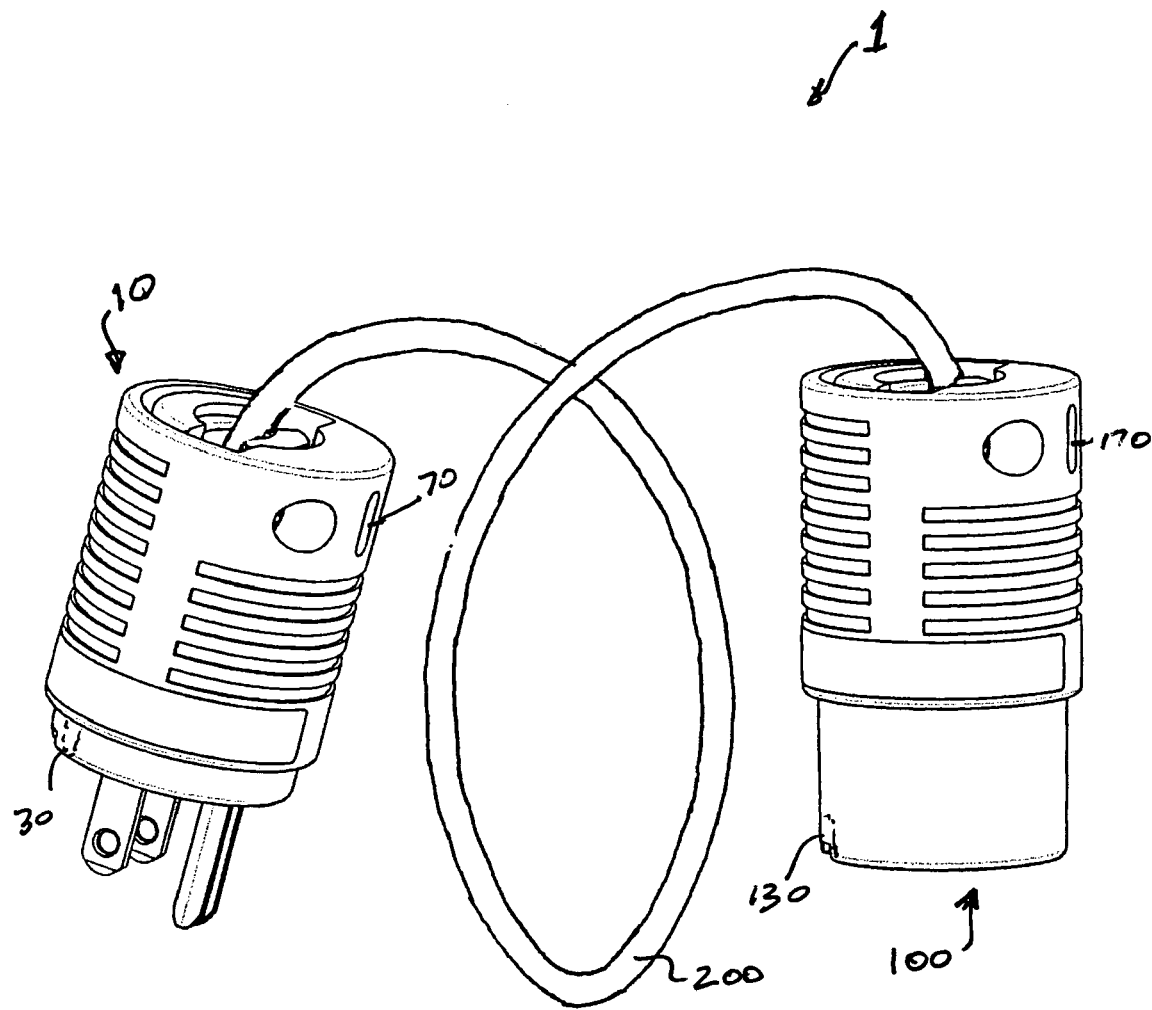
FIG. 6 is a perspective view of the electrical circuit test device in accordance with a second embodiment of the present invention.

As embodied herein, and depicted in FIG. 6, a perspective view of the electric circuit test device 1 in accordance with a second embodiment of the present invention is disclosed in which the circuit test device 10 is configured as a plug, as previously described, or the circuit test device 10 is configured as an electrical connector 100. Device 100 has receptacle contacts (not shown) configured to mate with the plug of a load device (not shown.) Device 100 receives power from the electrical distribution system through a connector cable 200. The opposite end of cable 200 is connected to plug assembly 40 (see FIG. 1). Device 10 includes a first indicator assembly 30 and device 100 includes a second indicator assembly 130. Device 10 is virtually identical to the description in the preceding paragraphs, with the exception that it is connected to cable 200. Device 10 is configured to be inserted in a receptacle. The receptacle includes electrical terminals coupled to an electric circuit. As noted above the electric circuit may be a single or multi-phase grounded neutral circuit or a 240 VAC center-ground circuit. Device 10 includes the appropriate fault detection circuit configured to detect circuit status conditions described above, in accordance with the embodiment and the type of circuit being tested. Fault indicator 30 is shown. Indicator 30 is configured to emit a code corresponding to the above described circuit status conditions. Connector cable 200 couples device 10 to device 100. Indicator assembly 130 includes components similar to the components described above. Device 100 is coupled to the connector cable such that electrical continuity is established between device 10 and device 100. Device 100 includes a second fault detection circuit (not shown) that is configured to detect a circuit status condition. Device 100 includes a fault indicator assembly 130 to show the circuit status in the electric circuit between the source of power of the electrical distribution system and device 100. Unlike device 10 which only provides circuit status indication of the electric circuit between the source of electrical power and device 10, device 100 additionally provides status indication of device 10 and connector cable 200. This embodiment is self-monitoring in that device 100 alerts a user to the presence of a fault condition in device 10.

As shown, devices 10 and 100 are located at the extremities of connector cable 200, providing maximum circuit status indication. Alternatively if maximum indication is not necessary, a conventional plug that does not include a circuit tester can replace device 10 (not shown.) A conventional plug would not impair the ability of indicator assembly 130 to provide circuit status indication of the electric circuit between the source of power of the electrical distribution system and device 100.

Figure 7:
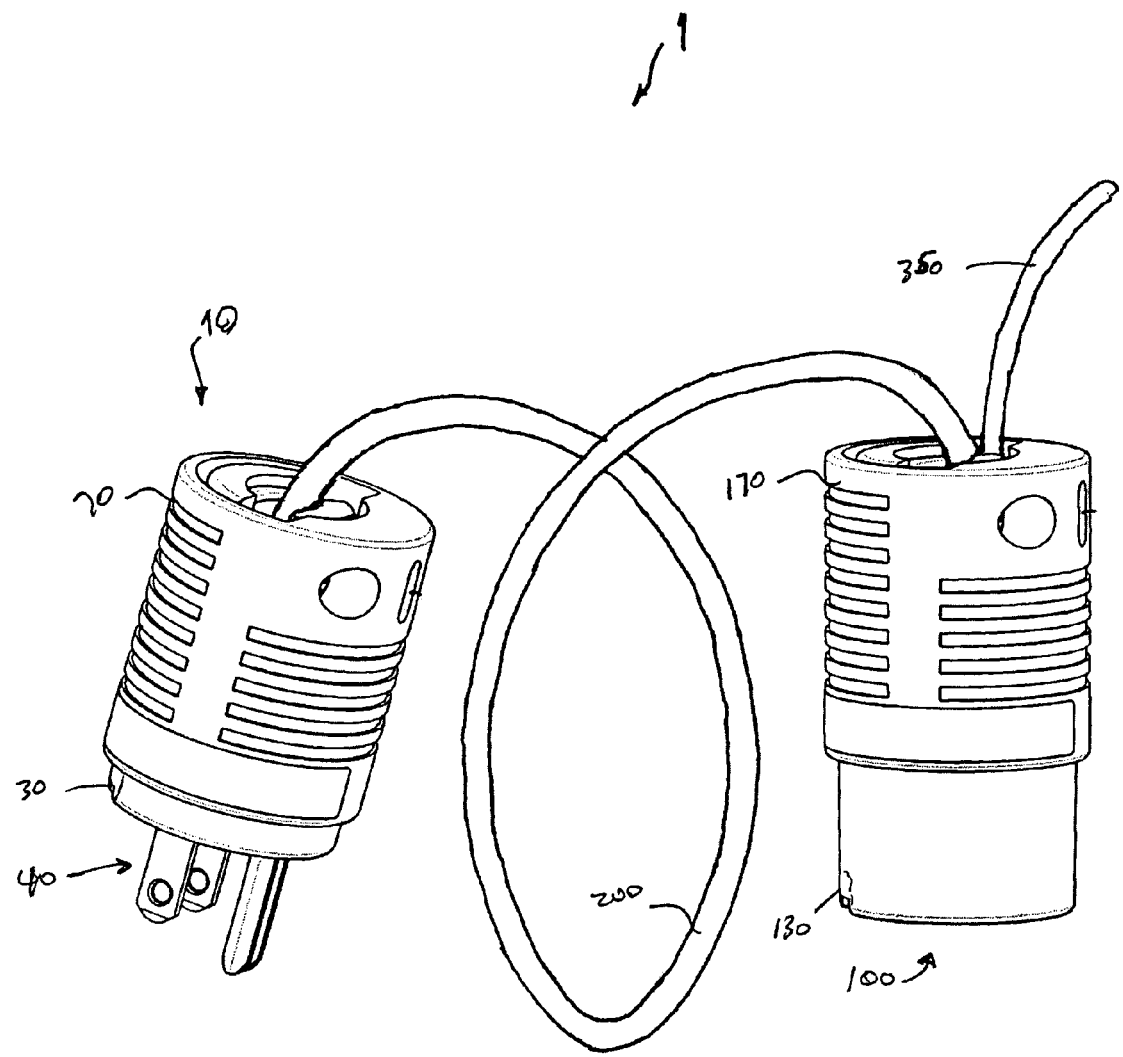
FIG. 7 is a perspective view of the electrical circuit test device in accordance with a third embodiment of the present invention.

As embodied herein, and depicted in FIG. 7, a perspective view of the electric circuit test device 1 in accordance with a third embodiment of the present invention is disclosed. This embodiment is virtually identical to the device 100 embodiment depicted in FIG. 6, except that diode 220 of the fault detection assembly 20 is disconnected from the ground terminal of device 100' and connected to ground sensing wire 350. Device 100' provides power to a load device (not shown) through a plug (not shown) and cordset (not shown.) The plug is configured to electrically mate with the receptacle contacts of device 100' (not shown.) The load device has a metal portion that is intended to be grounded. The metal portion can be, but is not limited to a metal enclosure that houses the load. The ground conductor in the cordset and the ground sensing wire are both attached to the metal portion. If there is a ground fault in the electric circuit such as has been previously described, or a ground fault in the circuit comprising the ground conductor in the cordset, the metal portion, or ground sensing wire 350, the fault condition is indicated by indicator assembly 130 in a similar manner as described in the preceding paragraphs. Ground sensing wire 350 can be a separate conductor, such as shown, or bundled as an additional conductor within the cordset. This embodiment is self-monitoring in that device 100' alerts a user to the presence of a fault condition in ground sensing wire 350.

In another embodiment, device 10 can be replaced by a conventional plug that does not include a circuit tester without impairing the ability of device 100' to provide circuit status indication as described in previous paragraphs, or the indication of a fault associated with the load device.

In another embodiment, the device 100' can be reconfigured to be included in a plug 10' to which the cordset of the load device is electrically attached.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. An electric circuit test device for testing an electric circuit, the test device being insertable in a receptacle, the receptacle including electrical terminals coupled to the electrical circuit, the device comprising:

a housing characterized by a longitudinal axis;

a plug blade assembly disposed within the housing and configured to mate with the electrical terminals, electrical continuity being established between the plug blade assembly and the electric circuit;

a fault detection circuit coupled to the plug blade assembly and disposed within the housing, the fault detection circuit being configured to detect a circuit status condition in the electrical circuit; and at least one circuit status indicator assembly coupled to the fault detection circuit and normal thereto, the at least one circuit status indicator assembly including a plurality of semiconductor light indicators connected substantially normal to the at least one circuit status indicator assembly, the plurality of semiconductor light indicators being configured to emit a code corresponding to the circuit status condition in a direction normal to the longitudinal axis with a viewing angle less than approximately 30°.

2. The device of claim 1, wherein the fault detection circuit is configured to detect the circuit status condition in a single phase grounded neutral electric circuit.

3. The device of claim 2, wherein the circuit status condition includes an open hot wire status condition.

4. The device of claim 2, wherein the circuit status condition includes an open neutral wire status condition.

5. The device of claim 2, wherein the circuit status condition includes an open ground status condition.

6. The device of claim 2, wherein the circuit status condition includes a hot/neutral reversed polarity status condition.

7. The device of claim 2, wherein the circuit status condition includes a properly wired and grounded status condition.

8. The device of claim 2, wherein the single phase grounded neutral electric circuit supports 120 VAC, 277 VAC, or 347 VAC.

9. The device of claim 1, wherein the fault detection circuit includes a mis-wire circuit portion, the mis-wire protection circuit portion prevents component destruction during a mis-wire condition, such that the device is operable after the mis-wire condition.

10. The device of claim 9, wherein the mis-wire protection circuit portion includes at one diode component inhibiting reverse biased current.

11. The device of claim 1, wherein the fault detection circuit includes a redundant ground current safety portion that prevents ground current from exceeding 500 microamperes.

12. The device of claim 11, wherein the ground current safety portion includes a plurality of resistors in series.

13. The device of claim 1, wherein the fault detection circuit is configured to detect the circuit status condition in a multi-phase center grounded electric circuit.

14. The device of claim 13, wherein the circuit status condition includes an open hot wire condition.

15. The device of claim 13, wherein the circuit status condition includes an open ground status condition.

16. The device of claim 13, wherein the circuit status condition includes a hot and ground reversed status condition.

17. The device of claim 13, wherein the circuit status condition includes an open hot wire status condition.

18. The device of claim 13, wherein the circuit status condition includes a properly wired and grounded status condition.

19. The device of claim 1, wherein the code emitted by the at least one circuit status indicator assembly is a Boolean code.

20. The device of claim 1, wherein the plurality of semiconductor light indicators further comprises a plurality of LED elements coupled to the fault detection circuit by way of a circuit board standoff element, the plurality of LED elements being configured to display the code.

21. The device of claim 20, wherein the plurality of LED elements comprise LEDs of a different color.

22. The device of claim 1, wherein the at least one fault detection circuit is implemented on a printed circuit board, the at least one fault detection circuit being coupled to the plug blade assembly by a torsion spring connector disposed on the printed circuit board.

23. The device of claim 1, further comprising an acoustic device configured to emit the circuit status condition.

24. An electric circuit test device for testing an electric circuit, the test device comprising:
a housing characterized by a longitudinal axis;
a connector cable coupled to the electric circuit and to the housing;
electrical terminals coupled to the connector cable, electrical continuity being established between the electrical terminals and the electric circuit;
a fault detection circuit coupled to the electrical terminals and disposed within the housing, the fault detection circuit being configured to detect a circuit status condition in the electrical circuit and connector cable; and
at least one circuit status indicator assembly coupled to the fault detection circuit and normal thereto, the at least one circuit status indicator assembly including a plurality of semiconductor light indicators connected substantially normal to the at least one circuit status indicator assembly, the plurality of semiconductor light indicators being configured to emit a code corresponding to the circuit status condition in a direction normal to the longitudinal axis with a viewing angle less than approximately 30°.

25. The device of claim 24 wherein the electric circuit includes a receptacle with second electrical terminals coupled to the electric circuit, further comprising a second electric circuit test device coupled to the receptacle and the connector, electrical continuity being established between the receptacle and the connector configured to detect a circuit status condition in the electrical circuit.

26. The device of claim 24 wherein the electric circuit includes a receptacle with second electrical terminals coupled to the electric circuit, further comprising:
a second housing characterized by a longitudinal axis;
a plug blade assembly disposed within the housing and configured to mate with the second electrical terminals, electrical continuity being established between the plug blade assembly and the second electrical terminals;
a second fault detection circuit coupled to the plug blade assembly and disposed within the housing, the fault detection circuit being configured to detect a circuit status condition in the electrical circuit; and
at least one second circuit status indicator assembly coupled to the fault detection circuit and normal thereto, the at least one circuit status indicator assembly including a plurality of semiconductor light indicators connected substantially normal to the at least one circuit status indicator assembly, the plurality of semiconductor light indicators being configured to emit a code corresponding to the circuit status condition in a direction normal to the longitudinal axis with a viewing angle less than approximately 30°.

27. The device of claim 26, wherein the electric circuit includes a load device further comprising a ground sensing wire coupled to the fault detection circuit, the ground sensing wire also being configured to be connected to a ground disposed on the load device, the circuit indicator assembly being configured to emit the circuit status condition detected in the load device, the connector cable, and the electric circuit.

28. The device of claim 24, wherein the electric circuit includes a load device further comprising a ground sensing wire coupled to the fault detection circuit, the ground sensing wire also being configured to be connected to a ground disposed on the load device, the circuit indicator assembly being configured to emit the circuit status condition detected in the load device, the connector cable, and the electric circuit.

29. The device of claim 28, wherein the circuit status indicator assembly further includes at least one standoff member coupled to the printed circuit board and extending in a direction substantially normal to the printed circuit board, the plurality of semiconductor light indicators being coupled to the stand-off member and extending in a direction substantially normal to the at least one standoff member.

30. The device of claim 28, wherein the circuit status indicator assembly includes an electromagnetic emission device configured to emit the circuit status condition.

31. The device of claim 30, wherein the electromagnetic emission device includes an RF transmission device.

32. The device of claim 24, wherein the circuit status condition includes an open hot wire condition.

33. The device of claim 24, wherein the circuit status condition includes an open ground status condition.

34. The device of claim 24, wherein the circuit status condition includes a hot and ground reversed status condition.

35. The device of claim 24, wherein the circuit status condition includes an open hot wire status condition.

36. The device of claim 24, wherein the circuit status condition includes a properly wired and grounded status condition.

37. The device of claim 24, wherein the fault detection circuit is configured to detect the circuit status condition in a single phase grounded neutral electrical circuit.

38. The device of claim 37, wherein the single phase grounded neutral electric circuit supports 120 VAC, 277 VAC, or 347 VAC.

39. The device of claim 24, wherein the fault detection circuit is configured to detect circuit status condition in a multi-phase center grounded electric circuit.

* * * * *